US008698321B2

(12) United States Patent
Suh

(10) Patent No.: US 8,698,321 B2
(45) Date of Patent: Apr. 15, 2014

(54) VERTICALLY STACKABLE DIES HAVING CHIP IDENTIFIER STRUCTURES

(75) Inventor: Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 807 days.

(21) Appl. No.: 12/574,919

(22) Filed: Oct. 7, 2009

(65) Prior Publication Data

US 2011/0079923 A1 Apr. 7, 2011

(51) Int. Cl.
*H01L 23/48* (2006.01)
*H01L 23/52* (2006.01)
*H01L 29/40* (2006.01)

(52) U.S. Cl.
USPC ....... 257/777; 438/67; 438/107; 257/E23.141

(58) Field of Classification Search
None
See application file for complete search history.

(56) References Cited

U.S. PATENT DOCUMENTS

| | | | |
|---|---|---|---|
| 6,448,661 B1 | 9/2002 | Kim et al. | |
| 7,111,149 B2 | 9/2006 | Eilert | |
| 7,317,256 B2 | 1/2008 | Williams et al. | |
| 7,327,590 B2 | 2/2008 | Matsui et al. | |
| 7,446,420 B1 | 11/2008 | Kim | |
| 2009/0135638 A1 | 5/2009 | Shimizu | |
| 2009/0135639 A1 | 5/2009 | Hirose | |
| 2011/0079924 A1 | 4/2011 | Suh | |
| 2013/0234340 A1 | 9/2013 | Suh | |
| 2013/0277861 A1 | 10/2013 | Suh | |
| 2013/0280863 A1 | 10/2013 | Suh | |

FOREIGN PATENT DOCUMENTS

| | | |
|---|---|---|
| CN | 101330076 A | 12/2008 |
| JP | H08288333 A | 11/1996 |
| JP | 2001273755 A | 10/2001 |
| JP | 2003101245 A | 4/2003 |
| JP | 2005122823 A | 5/2005 |
| JP | 2005340389 A | 12/2007 |
| JP | 2007536581 A | 12/2007 |
| JP | 2009129498 A | 6/2009 |
| KR | 1008713841 B1 | 12/2008 |

OTHER PUBLICATIONS

International Search Report and Written Opinion—PCT/US2010/051860—ISA/EPO—Apr. 14, 2011.

*Primary Examiner* — Thien F Tran
(74) *Attorney, Agent, or Firm* — Sam Talpalatsky; Nicholas J. Pauley; Joseph Agusta

(57) ABSTRACT

A vertically stackable die having a chip identifier structure is disclosed. In a particular embodiment, a semiconductor device is disclosed that includes a die comprising a first through silicon via to communicate a chip identifier and other data. The semiconductor device also includes a chip identifier structure that comprises at least two through silicon vias that are each hard wired to an external electrical contact.

15 Claims, 8 Drawing Sheets

VERTICALLY STACKABLE DIES HAVING CHIP IDENTIFIER STRUCTURES

I. FIELD

The present disclosure is generally related to vertically stackable dies.

II. DESCRIPTION OF RELATED ART

Vertical stacking of memory dies and chips may be used to increase memory density in a semiconductor device. In a vertically stacked memory die and logic die, the memory die size may be limited to be less than the logic die size because of stacking process throughput and other factors. This limits the usable memory density and leads to the use of next-generation memory dies to meet the usable memory density requirements. Vertically stacked memory dies may be used to meet the memory density requirements, but conventional vertically stacked memory dies have an increased stacking complexity related to sharing the same channel to the logic die and increased costs associated therewith, such as programming, sorting, marking, or separating each of the memory dies in the vertical stack of memory dies.

III. SUMMARY

Multiple dies of a vertical stack of two or more dies are substantially the same and the stack of dies is formed without programming, sorting, marking, or separating each die in the vertical stack. A physically predetermined chip identifier structure distinguishes each die in a stack and a channel interface may be shared among the stacked multiple dies. No non-volatile programming of the dies is needed. Forming the stack of dies without programming or sorting the stacked dies reduces the total cost and provides simpler chip logistics.

In a particular embodiment, a semiconductor device is disclosed that includes a die comprising a first through silicon via to communicate a chip identifier and other data. The semiconductor device also includes a chip identifier structure that comprises at least two through silicon vias that are each hard wired to an external electrical contact.

In another particular embodiment, a multi-die stacked semiconductor device is disclosed that includes a first die comprising a first chip identifier structure that comprises a number N of through silicon vias that are each hard wired to a first set of external electrical contacts, the number N comprising an integer greater than one. The multi-die stacked semiconductor device also includes a second die comprising a second chip identifier structure that comprises N through silicon vias that are each hard wired to a second set of electrical contacts.

In another particular embodiment, a method of making a stacked multi-die semiconductor device is disclosed that includes forming a stack of N dies, where each die includes a chip identifier structure that comprises a first set of N through silicon vias that are each hard wired to a set of external electrical contacts, chip identifier selection logic coupled to the chip identifier structure, and a chip select structure that comprises a second set of N through silicon vias coupled to the chip identifier selection logic, wherein N is an integer greater than one. The method also includes coupling each external electrical contact in each set of external electrical contacts to a voltage source or to ground, where each of the first set of N through silicon vias has a pad that is coupled to an adjacent through silicon via and each of the second set of N through silicon vias is coupled to its own respective pad.

In another particular embodiment, a multi-die stacked semiconductor device is disclosed that includes a first die comprising first means for identifying a chip that comprises a number N of through silicon vias that are each hard wired to a first set of means for making external electrical contact, the number N comprising an integer greater than one. The multi-die stacked semiconductor device also includes a second die comprising second means for identifying a chip that comprises N through silicon vias that are each hard wired to a second set of means for making electrical contact.

In another particular embodiment, a method is disclosed that includes receiving a chip identifier signal based on a position of a first die within a die stack. The chip identifier signal is received at the first die via multiple through silicon vias of the first die. The method also includes determining, based on the received chip identifier signal, whether the first die is a particular die that is indicated by a received chip selection signal.

One particular advantage provided by at least one of the disclosed embodiments is that each die of a vertical stack of two or more dies is substantially the same and the stack of dies is formed without programming, sorting, marking, or separating each die in the vertical stack. Using the same die without any programming or different sorting in the stacked dies reduces the total cost and provides simpler chip logistics. No non-volatile programming of the dies is needed. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
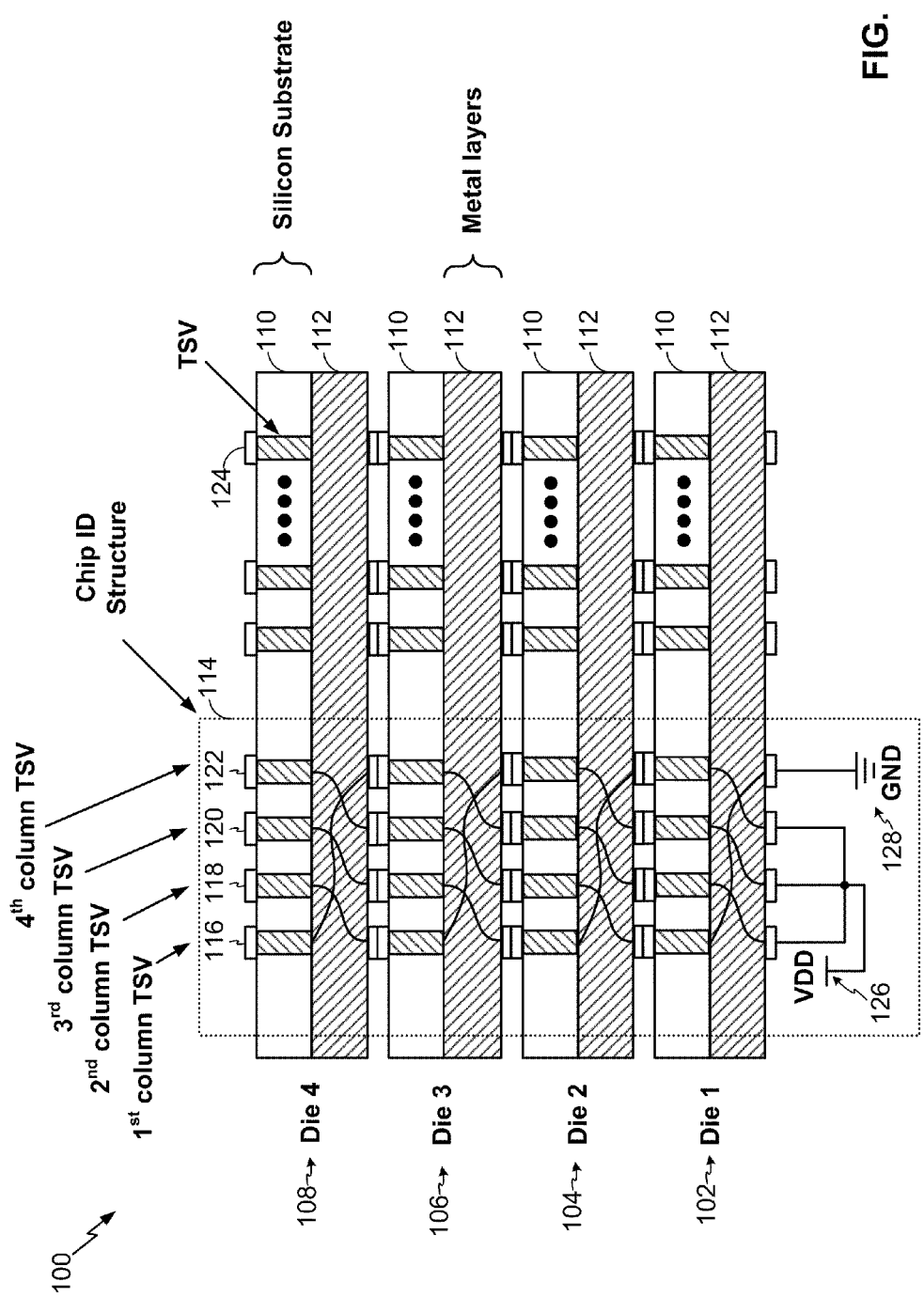
FIG. 1 is an illustrative diagram of a first embodiment of vertically stacked dies having a chip identifier structure.

Particular embodiments of the present disclosure are described below with reference to the drawings. In the description, common features are designated by common reference numbers through the drawings. Referring to FIG. 1, an illustrative diagram of a first embodiment of vertically stacked dies having a chip identifier structure is depicted and generally designated 100. A vertical stack 100 may include a first die 102, a second die 104, a third die 106, and a fourth die 108, with the fourth die 108 stacked above the third die 106 that is stacked above the second die 104 that is stacked above the first die 102. Each die 102-108 includes a silicon substrate 110 and a metal layer 112. Each die also includes at least one through silicon via (TSV) 124 extending through the silicon substrate 110 to communicate a chip identifier and other data. Each die further includes a chip identifier structure 114 that includes at least two through silicon via (TSVs) that are each hard wired to an external electrical contact. In a particular embodiment, the external electrical contact is coupled to a voltage source VDD 126 or to a ground 128. The voltage source VDD 126 or the ground 128 may be received from a package substrate or a mother die, for example.

The chip identifier structure 114 for each die includes a first column TSV 116, a second column TSV 118, a third column TSV 120, and a fourth column TSV 122, for example. Tracing through the connections in the respective metal layers 112, the fourth column TSV 122 of the fourth die 108 is coupled to the third column TSV 120 of the third die 106, which is coupled to the second column TSV 118 of the second die 104, which is coupled to the first column TSV 116 of the first die 102, which is coupled to the ground 128. Similarly, the third column TSV 120 of the fourth die 108 is coupled to the second column TSV 118 of the third die 106, which is coupled to the first column TSV 116 of the second die 104, which is coupled to the fourth column TSV 122 of the first die 102, which is coupled to the voltage source VDD 126. Likewise, the second column TSV 118 of the fourth die 108 is coupled to the first column TSV 116 of the third die 106, which is coupled to the fourth column TSV 122 of the second die 104, which is coupled to the third column TSV 120 of the first die 102, which is also coupled to the voltage source VDD 126. Finally, the first column TSV 116 of the fourth die 108 is coupled to the fourth column TSV 122 of the third die 106, which is coupled to the third column TSV 120 of the second die 104, which is coupled to the second column TSV 118 of the first die 102, which is also coupled to the voltage source VDD 126.

The connections between the chip identifier structures 114 in the respective metal layers 112 are the same in each die and are such that each die may be uniquely selected based on which column TSV 116-122 is connected to the ground 128. For example, the first column TSV 116 of the first die 102 is connected to the ground 128, the second column TSV 118 of the second die 104 is connected to the ground 128, the third column TSV 120 of the third die 106 is connected to the ground 128, and the fourth column TSV 122 of the fourth die 108 is connected to the ground 128. Each die in the vertical stack 100 may recognize its vertical location based on which column TSV 116-122 is connected to the ground 128, for example. In an alternative embodiment, all but one of the column TSVs 116-122 are coupled to the ground 128, while one of the column TSVs 116-122 is coupled to the voltage source VDD 126, in which case each die may be uniquely selected based on which column TSV 116-122 is connected to the voltage source VDD 126. Each die 102-108 has the same chip identifier structure 114 that includes the same TSV structure in each silicon substrate 110 and the same wiring in each metal layer 112.

Each die of the vertical stack 100 of two or more dies is substantially the same and the vertical stack 100 of dies 102, 104, 106, 108 is formed without programming, sorting, marking, or separating each die in the vertical stack 100. The physically predetermined chip identifier structure 114 distinguishes each die in the vertical stack 100 and a channel interface may be shared among the stacked multiple dies 102, 104, 106, 108. Using the same die without any programming or different sorting in the vertical stack 100 may reduce the total cost and provide simpler chip logistics. No non-volatile programming of the dies 102, 104, 106, 108 is needed.

Figure 2:
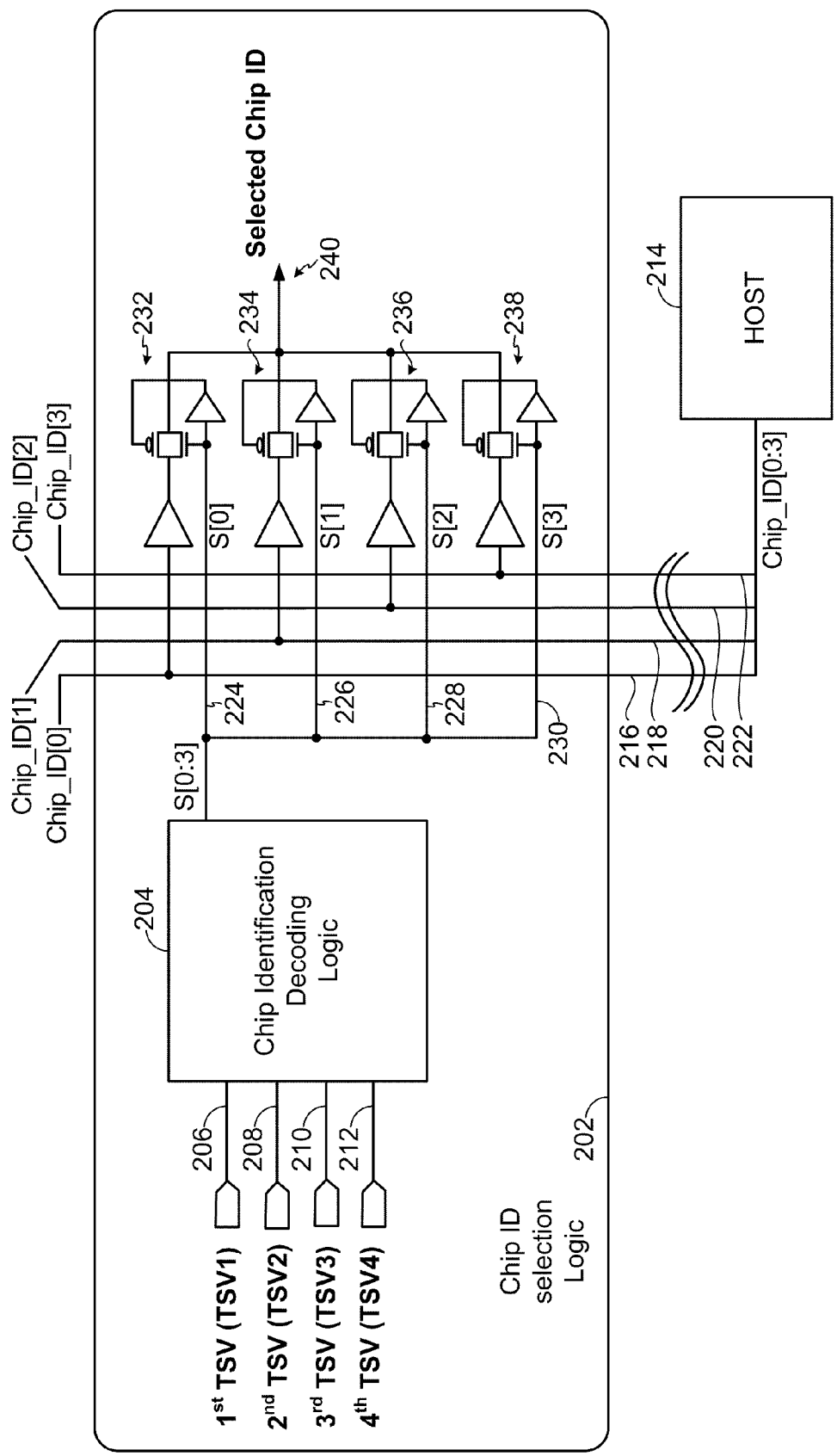
FIG. 2 is an illustrative diagram of an embodiment of chip identifier selection logic.

Referring to FIG. 2, an illustrative diagram of an embodiment of chip identifier selection logic is depicted and generally designated 202. Each die in the vertical stack 100 of dies 102, 104, 106, 108 of FIG. 1 may receive a specific and different chip identifier signal from a host device 214 by the chip identifier selection logic 202. In a particular embodiment, an interface to the host device 214 is provided. The host device 214 may be a separate device or a mother die, for example.

The host device 214 may access any specific die though a common access channel structure is shared among multiple dies, such as a common access channel structure 306 shown in FIG. 3 and FIG. 4 and described more fully below. The host device 214 may provide chip select signals Chip ID[0:3] and data signals Data[0:n] via a shared interface between the host device 214 and the dies 102-108 in the vertical stack 100 of dies. The chip select signals Chip ID[0:3] and the data signals Data[0:n] may be applied to TSVs to be accessible to all dies 102-108 in the vertical stack 100 of dies. The data signals Data[0:n] may therefore be sent from the host device 214 via the common access channel structure 306 to any specific die, where the specific die is selected using the chip identifier selection logic 202. The shared interface between the host device 214 and the vertical stack 100 of dies 102, 104, 106, 108 of FIG. 1 is not illustrated in FIG. 2 for the sake of simplicity.

In a particular embodiment, chip identification decoding logic 204 is coupled to the chip identifier structure 114 of FIG. 1 and accepts as inputs the column TSVs 116, 118, 120, and 122 via lines 206, 208, 210, and 212, respectively. The chip identifier selection logic 202 may include the chip identification decoding logic 204 and may be responsive to the chip select signals Chip ID[0:3] from the host device 214. The chip identifier selection logic 202 may detect the voltage source VDD 126 of FIG. 1 or the ground 128 at the TSVs in the chip identifier structure 114. Signals from the first column TSV 116 of FIG. 1 may be input to the chip identification decoding logic 204 via line 206. Signals from the second column TSV 118 of FIG. 1 may be input to the chip identification decoding logic 204 via line 208. Signals from the third column TSV 120 of FIG. 1 may be input to the chip identification decoding logic 204 via line 210. Signals from the fourth column TSV 122 of FIG. 1 may be input to the chip identification decoding logic 204 via line 212.

Signal S[0] may be output from the chip identification decoding logic 204 via line 224 and may be a control signal to a selection circuit 232 that may determine whether the first chip is selected. In order to determine whether the first chip is selected, signal Chip ID[0] on line 216 from the host device 214 is output from the chip identifier selection logic 202 along a line 240. Signal S[1] may be output from the chip identification decoding logic 204 via line 226 and may be a control signal to a selection circuit 234 that may determine whether signal Chip ID[1] on line 218 from the host device 214 is output from the chip identifier selection logic 202 along the line 240. Signal S[2] may be output from the chip identification decoding logic 204 via line 228 and may be a control signal to a selection circuit 236 that may determine whether signal Chip ID[2] on line 220 from the host device 214 is output from the chip identifier selection logic 202 along the line 240. Signal S[3] may be output from the chip identification decoding logic 204 via line 230 and may be a control signal to a selection circuit 238 that may determine whether signal Chip ID[3] on line 222 from the host device 214 is output from the chip identifier selection logic 202 along the line 240.

Using the first die 102 of FIG. 1 as an illustrative example, the first column TSV 116 is connected to the ground 128 and the second column TSV 118, the third column TSV 120, and the fourth column TSV 122 are all connected to the voltage source VDD 126 as a result of the position of the first die 102 within the vertical stack 100 of dies. In this case, the input along the line 206 would be a logic "low" and the inputs along the lines 208, 210, and 212 would all be a logic "high." The chip identification decoding logic 204 may invert the inputs so that the signal S[0] along the line 224 is a logic "high" signal while the signals S[1], S[2], and S[3] along the lines 226, 228, and 230, respectively, are all logic "low" signals. Because the signal S[0] is a logic "high," the N-type Metal Oxide Semiconductor (NMOS) transistor of the pass gate of the selection circuit 232 is turned on. The signal S[0] is also inverted to a logic "low," which turns on the P-type Metal Oxide Semiconductor (PMOS) transistor of the pass gate of the selection circuit 232. Because the NMOS and the PMOS are on, the pass gate of the selection circuit 232 has a low impedance state that enables signal propagation, as opposed to a high impedance state when the NMOS and the PMOS are off. The signal Chip ID[0] along the line 216 is inverted and passes through the low impedance pass gate of the selection circuit 232 to be the selected output from the chip identifier selection logic 202 along the line 240.

By way of contrast, because the signal S[1] is a logic "low," the NMOS transistor of the pass gate of the selection circuit 234 is turned off. The signal S[1] is inverted to a logic "high," which turns off the PMOS transistor of the pass gate of the selection circuit 234. The signal Chip ID[1] along the line 218 may be inverted, but does not pass through the high impedance pass gate of the selection circuit 234. Similarly, because the signal S[2] and S[3] are at a logic "low," the pass gates of the selection circuit 236 and the selection circuit 238 are also at the high impedance state. As a result, based on the signals received at the TSVs 116-122, the chip identifier selection logic 202 of the first die 102 generates the output along the line 240 based on the chip select signal Chip ID[0] and not the chip select signals Chip ID[1:3]. To illustrate, when the chip select signal Chip ID[0] has a "high" state, the output along the line 240 is "low," and when the chip select signal Chip ID[0] has a "low" state, the output along the line 240 is "high." In this way, the first die 102 of FIG. 1 may be selected or deselected based on the position of the first die 102 in the vertical stack 100 of dies and the chip select signals Chip ID[0:3] provided by the host device 214. When selected, the data signals Data[0:n] from the host device 214 may be accessed by the first die 102 of FIG. 1. When not selected, the data signals Data[0:n] may not be accessed by the first die 102 and instead may be accessed by another die in the vertical stack 100 of dies.

Figure 3:
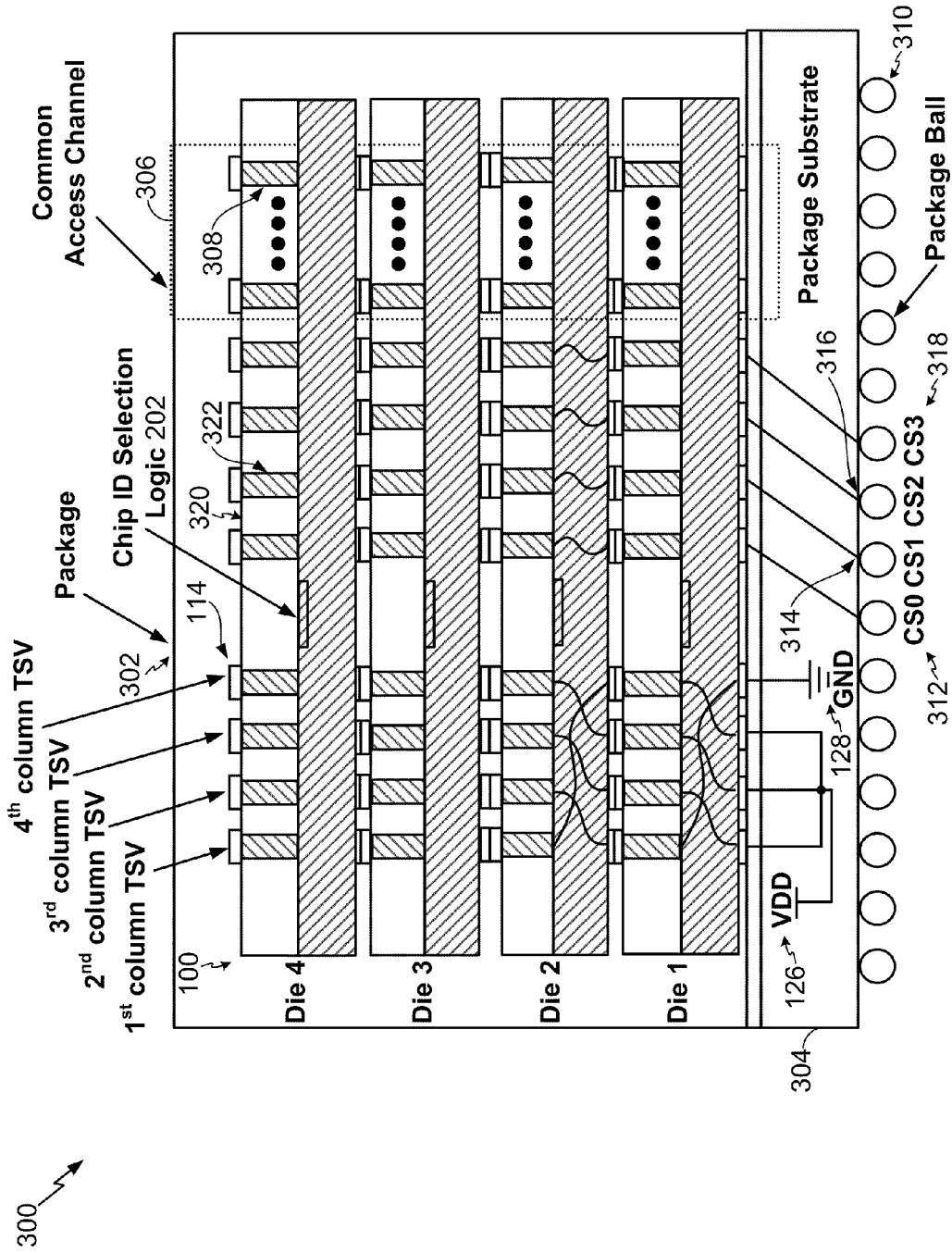
FIG. 3 is an illustrative diagram of a second embodiment of vertically stacked dies having a chip identifier structure disposed in a package above a package substrate.

Referring to FIG. 3, an illustrative diagram of a second embodiment of vertically stacked dies having a chip identifier structure disposed in a package above a package substrate is depicted and generally designated 300. The vertical stack 100 of FIG. 1 may be disposed in a package 302 above a package substrate 304. Each die of the vertical stack 100 has a chip select structure 320 that includes a TSV for every die in the vertical stack 100. The TSVs in the chip select structures 320 may be coupled together to form columns 322 extending through the vertical stack 100. Each die of the vertical stack 100 also has the chip identifier selection logic 202 of FIG. 2 coupled to the chip identifier structure 114 and to the chip select structure 320. Each die of the vertical stack 100 further has the common access channel structure 306 that includes a plurality of TSVs 308 to provide the data signals Data[0:n] to be accessible to each die.

The package substrate 304 supplies the voltage source 126 and the ground 128 that are coupled to the chip identifier structures 114 of the vertical stack 100 as described above with respect to FIG. 1. The package substrate 304 has a plurality of package balls 310 formed on a side of the package substrate 304 opposite to the vertical stack 100. The plurality of package balls 310 includes a chip select package ball for every die in the vertical stack 100. For example, a chip select package ball (CS0) 312 may be coupled to the first of the columns 322 of TSVs in the chip select structures 320, a chip select package ball (CS1) 314 may be coupled to the second of the columns 322 of TSVs in the chip select structures 320, a chip select package ball (CS2) 316 may be coupled to the third of the columns 322 of TSVs in the chip select structures 320, and a chip select package ball (CS3) 318 may be coupled to the fourth of the columns 322 of TSVs in the chip select structures 320. In a particular embodiment, where there are N dies in the vertical stack 100, the plurality of package balls 310 includes at least N chip select package balls coupled to a set of N TSVs in the chip select structure 320 of one die of the vertical stack 100.

In a particular embodiment, each die in the vertical stack 100 is a memory die, providing an increased total memory density. Each die in the vertical stack 100 has the same implementation and no programming or sorting or marking or separating of the dies would be necessary before packaging in the package 302. The chip identifier structure 114 TSV columns may be hard wired in the package substrate 304. Any number N of dies may be stacked in the vertical stack 100, where N is an integer greater than one.

Figure 4:
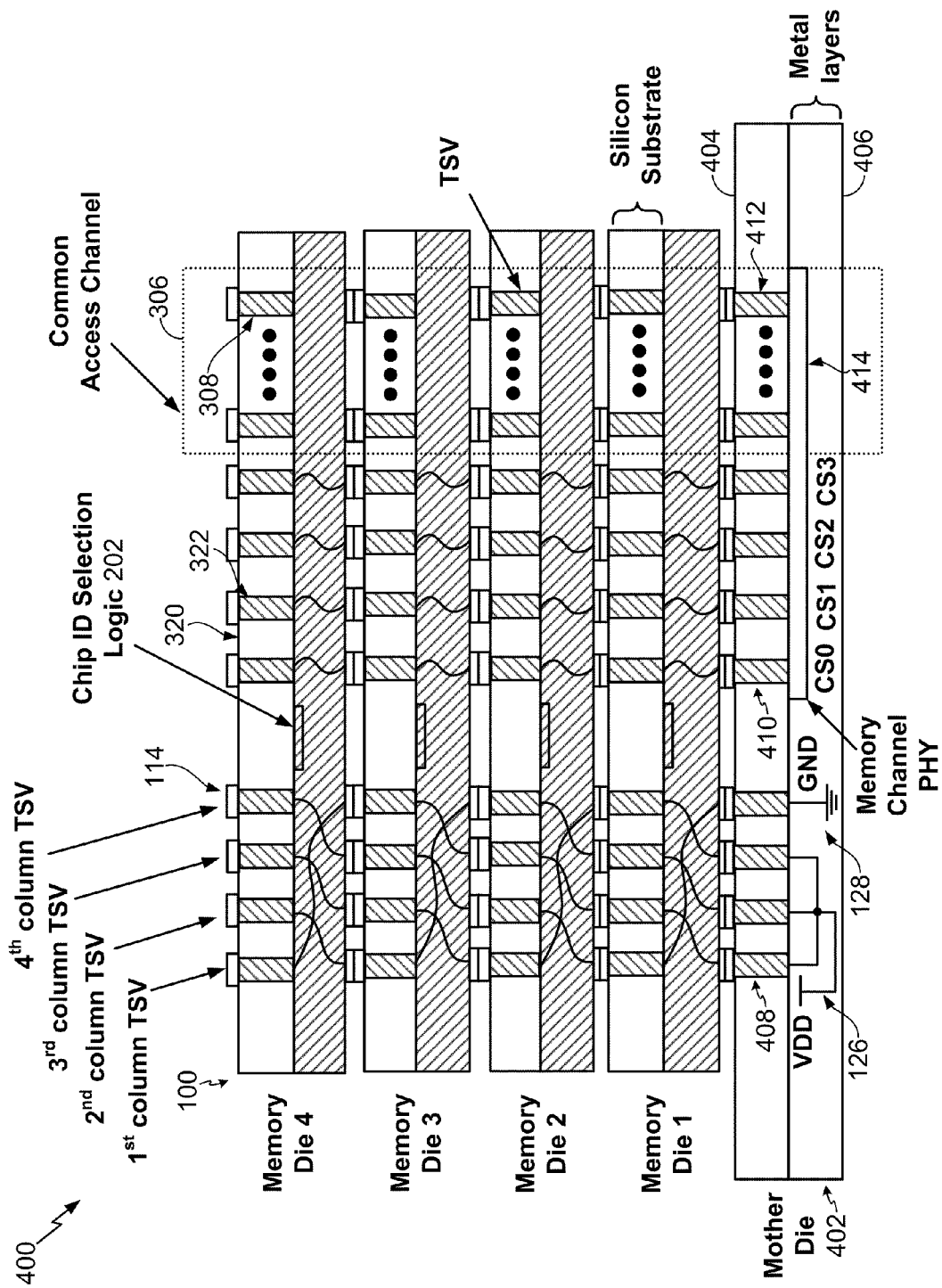
FIG. 4 is an illustrative diagram of a third embodiment of vertically stacked dies having a chip identifier structure disposed above a mother die.

Referring to FIG. 4, an illustrative diagram of a third embodiment of vertically stacked dies having a chip identifier structure disposed above a mother die is depicted and generally designated 400. The vertical stack 100 of FIG. 1 may be disposed above a mother die 402. Each die of the vertical stack 100 has the chip select structure 320 that includes a TSV for every die in the vertical stack 100. The TSVs in the chip select structures 320 may be coupled together to form the columns 322 extending through the vertical stack 100. Each die of the vertical stack 100 also has the chip identifier selection logic 202 of FIG. 2 coupled to the chip identifier structure 114 and to the chip select structure 320. Each die of the vertical stack 100 further has the common access channel structure 306 that includes the plurality of TSVs 308.

The mother die 402 supplies the voltage source 126 and the ground 128 that are coupled to the chip identifier structures 114 of the vertical stack 100 as described above with respect to FIG. 1. The voltage source 126 and the ground 128 may be disposed in a metal layer 406 of the mother die 402. The voltage source 126 and the ground 128 may be coupled to the chip identifier structures 114 of the vertical stack 100 by chip identifier TSVs 408 extending through a silicon substrate 404 of the mother die 402, one chip identifier TSV 408 for every die in the vertical stack 100. In a particular embodiment, where there are N dies in the vertical stack 100, a set of N chip identifier TSVs 408 is coupled to a set of N TSVs in the chip identifier structure 114 of one die of the vertical stack 100.

A set of chip select TSVs 410, one for each of the dies in the vertical stack 100, may extend through the silicon substrate 404 of the mother die 402. The set of chip select TSVs 410 may be coupled to the columns 322 formed by the TSVs in the chip select structures 320 extending through the vertical stack 100. For example, a chip select signal (CS0) may be coupled by the first chip select TSV 410 to the first of the columns 322 of TSVs in the chip select structures 320, providing access to the first of the dies of the vertical stack 100. A chip select signal (CS1) may be coupled by the second chip select TSV 410 to the second of the columns 322 of TSVs in the chip select structures 320, providing access to the second of the dies of the vertical stack 100. A chip select signal (CS2) may be coupled by the third chip select TSV 410 to the third of the columns 322 of TSVs in the chip select structures 320, providing access to the third of the dies of the vertical stack 100. A chip select signal (CS3) may be coupled by the fourth chip select TSV 410 to the fourth of the columns 322 of TSVs in the chip select structures 320, providing access to the fourth of the dies of the vertical stack 100. In a particular embodiment, where there are N dies in the vertical stack 100, a set of N chip select TSVs 410 is coupled to a set of N TSVs in the chip select structure 320 of one die of the vertical stack 100.

A set of common access channel TSVs 412 may extend through the silicon substrate 404 of the mother die 402. Each of the common access channel TSVs 412 may correspond to one of the plurality of TSVs 308 included in the common access channel structures 306 of each die in the vertical stack 100.

In a particular embodiment, the mother die 402 includes a logic chip and each die in the vertical stack 100 is a memory die, providing an increased total memory density. Each of the chip select TSVs 410 and each of the common access channel TSVs 412 may be coupled to a memory channel physical layer 414 of the mother die 402. Any number N of memory dies may be stacked in the vertical stack 100, where N is an integer greater than one.

Figure 5:
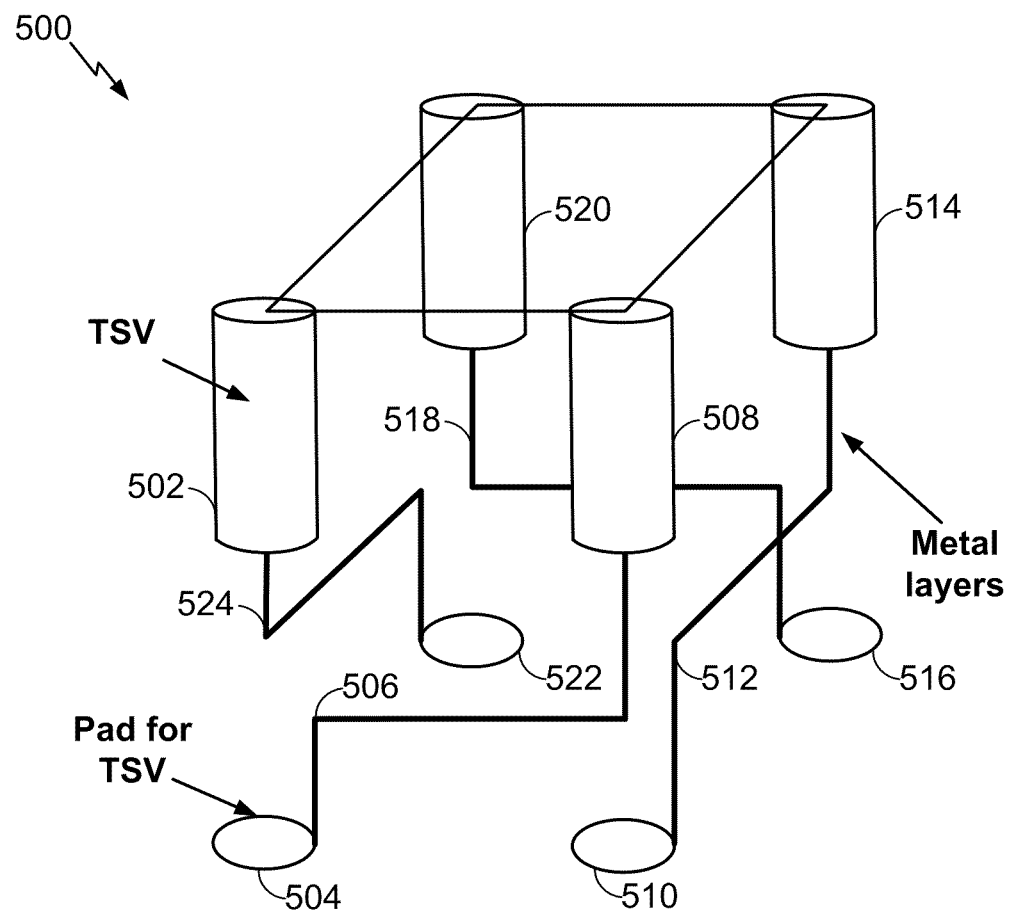
FIG. 5 is an illustrative diagram of an embodiment of through silicon vias (TSVs) coupled to pads of adjacent through silicon vias (TSVs)

Referring to FIG. 5, an illustrative diagram of an embodiment of through silicon vias (TSVs) coupled to pads of adjacent through silicon vias (TSVs) is depicted and generally designated 500. A TSV 502, which may be a TSV in a chip identifier structure similar to the chip identifier structure 114 of FIG. 1, has a pad 504 that may be coupled by a line 506 to an adjacent TSV 508 in the chip identifier structure. The TSV 508 has a pad 510 that may be coupled by a line 512 to an adjacent TSV 514 in the chip identifier structure. The TSV 514 has a pad 516 that may be coupled by a line 518 to an adjacent TSV 520 in the chip identifier structure. The TSV 520 has a pad 522 that may be coupled by a line 524 to the adjacent TSV 502 in the chip identifier structure. The lines 506, 512, 518, and 524 may be disposed in a metal layer similar to the metal layer 112 of FIG. 1. While only four TSVs 502, 508, 514, and 520 are shown in FIG. 5, this arrangement where a TSV in a chip identifier structure has a pad that is coupled to an adjacent TSV in the chip identifier structure may be generalized to any number N of TSVs, with N being an integer greater than one. In a chip select structure, similar to the chip select structure 320 of FIG. 3 and FIG. 4, each TSV may be coupled to its own respective pad.

A chip identifier structure including TSVs as illustrated in FIG. 5 may enable a distinct chip identification signal to be conveyed to each die in a stack as a result of each TSV receiving a signal that is applied to a pad of an adjacent TSV from another die. For example, a chip identifier signal may be received based on a position of a first die within a die stack, where the chip identifier signal is received at the first die via multiple through silicon vias of the first die. To illustrate, the chip identifier signal may include voltages at each TSV 116, 118, 120, and 122 of the chip identifier structure 114 of FIG. 1. The first die may determine, based on the received chip identifier signal, whether the first die is a particular die that is indicated by a received chip selection signal. For example, the first die may decode the chip identifier signal via the chip identification decoding logic 204 of FIG. 2 and compare a resulting signal (such as one of the signals S[0:3] of FIG. 2) to the received chip selection signal, as described with respect to FIG. 2.

In a particular embodiment, each die may receive a distinct chip ID signal as a result of the wiring between TSVs and adjacent pads and without implementing active logic or other circuitry to increment or otherwise generate or modify a received chip identifier signal. Using the structure of FIG. 5 as an illustrative example, a first TSV 502 of a chip identifier structure of a first die may have a pad 504 that is coupled to a second TSV 508 of the chip identifier structure (such as the chip identifier structure 114 of FIG. 1), the second TSV 508 adjacent to the first TSV 502. At least a portion of the chip identifier signal, such as a signal corresponding to the ground 128 that is provided to one of the multiple TSVs 116, 118, 120, and 122, is received at the pad 504 from a first TSV of a second die and is conveyed to the second TSV 508 of the first die. To illustrate, the first column TSV 116 of the die 102 of FIG. 1 may convey the signal corresponding to the ground 128 via a pad of the die 104 that is coupled to the second TSV 118 of the die 104.

The vertical stack 100 of FIG. 1, FIG. 3, and FIG. 4 provides an example of a multi-die stacked semiconductor device that has at least a first die 102 having the chip identifier structure 114 that has a number N of TSVs that are each hard wired to a first set of external electrical contacts, the number N being an integer greater than one. The number N may be equal to the number of dies in the vertical stack 100. The multi-die stacked semiconductor device (e.g., the vertical stack 100) also has at least a second die 104 having the chip identifier structure 114 that has N TSVs that are each hard wired to a second set of external electrical contacts. In a particular embodiment, each external electrical contact in the first set of the external electrical contacts and in the second set of external electrical contacts is coupled to the ground 128 or to the voltage source VDD 126. Each of the N TSVs may have a pad that is coupled to an adjacent TSV in each of the chip identifier structures 114, as shown in FIG. 5, for example.

Figure 6:
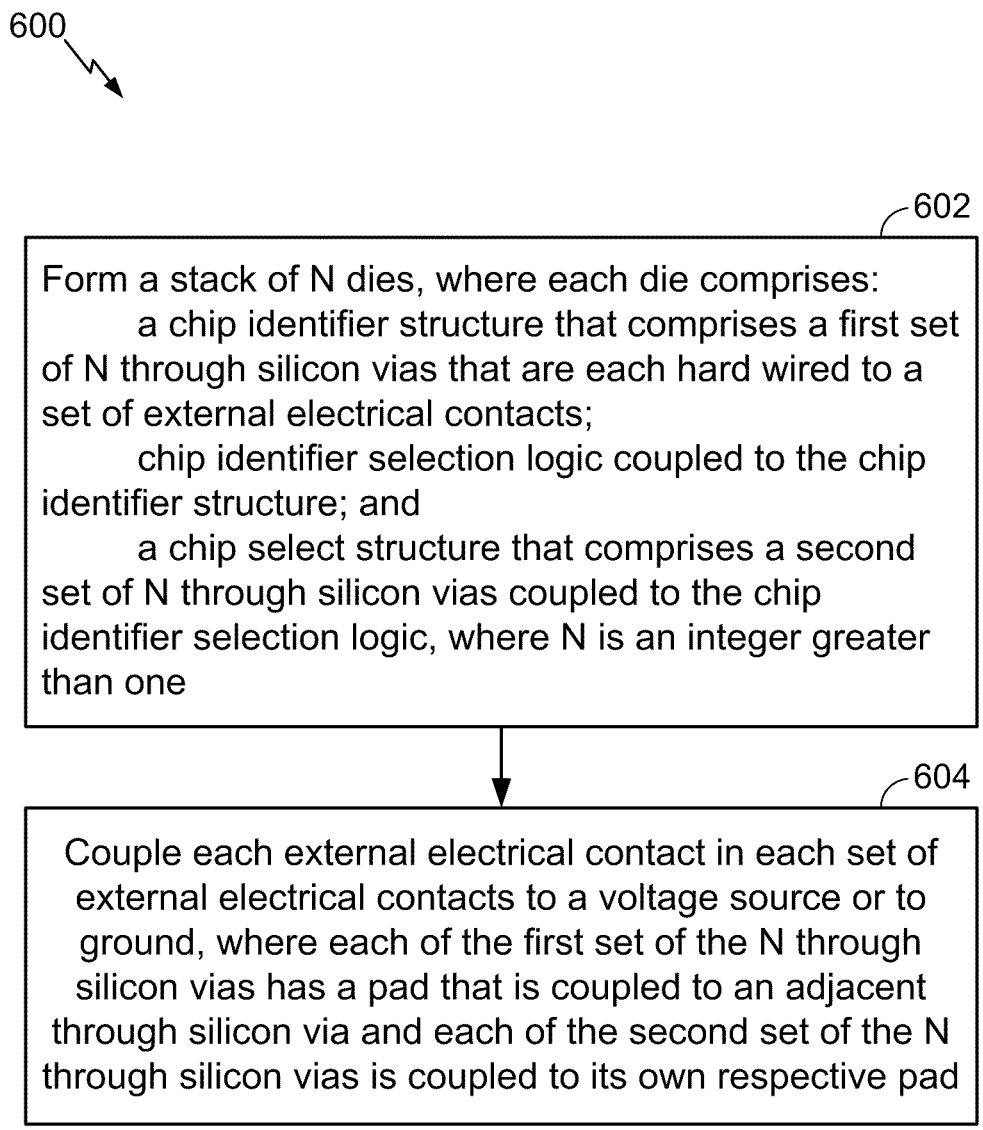
FIG. 6 is a flow diagram of an illustrative embodiment of a method of forming vertically stacked dies having a chip identifier structure.

Referring to FIG. 6, a flow diagram of an illustrative embodiment of a method of forming vertically stacked dies having a chip identifier structure is depicted and generally designated 600. The method 600 of making a stacked multi-die semiconductor device includes forming a stack of N dies, at 602, where N is an integer greater than one. Each of the N dies includes a chip identifier structure that includes a first set of N TSVs that are each hard wired to a set of external electrical contacts. Each of the N dies also includes chip identifier selection logic coupled to the chip identifier structure. Each of the N dies further includes a chip select structure that includes a second set of N TSVs coupled to the chip identifier selection logic. For example, the vertical stack 100 of FIG. 1 may be a stack of four dies 102, 104, 106, and 108, each die including the chip identifier structure 114 that includes a first set of four TSVs that are each hard wired to a set of external electrical contacts. Each die of the vertical stack 100 may also include the chip identifier selection logic 202 of FIG. 2 that is coupled to the chip identifier structure 114. Each die of the vertical stack 100 may further include the chip select structure 320 of FIG. 3 and FIG. 4 that includes a second set of four TSVs coupled to the chip identifier selection logic 202.

The method 600 also includes coupling each external electrical contact in each set of external electrical contacts to a voltage source or to ground, at 604. Each of the first set of N TSVs has a pad that is coupled to an adjacent TSV. Each of the second set of N TSVs is coupled to its own respective pad. For example, each TSV in the chip identifier structure 114 of FIG.

1 may be either coupled to the voltage source VDD 126 or to the ground 128. Each of the first set of four TSVs may have a pad that is coupled to an adjacent TSV as shown in FIG. 5, for example. Each of the second set of four TSVs in the chip select structure 320 of FIG. 3 and FIG. 4 may be coupled to its own respective pad. In a particular embodiment, each die of the vertical stack 100 of FIG. 1, FIG. 3, and FIG. 4 further includes a common access channel structure that includes a plurality of TSVs. For example, each die of the vertical stack 100 of FIG. 3 and FIG. 4 may further include the common access channel structure 306 that may include a plurality of TSVs 308.

Figure 7:
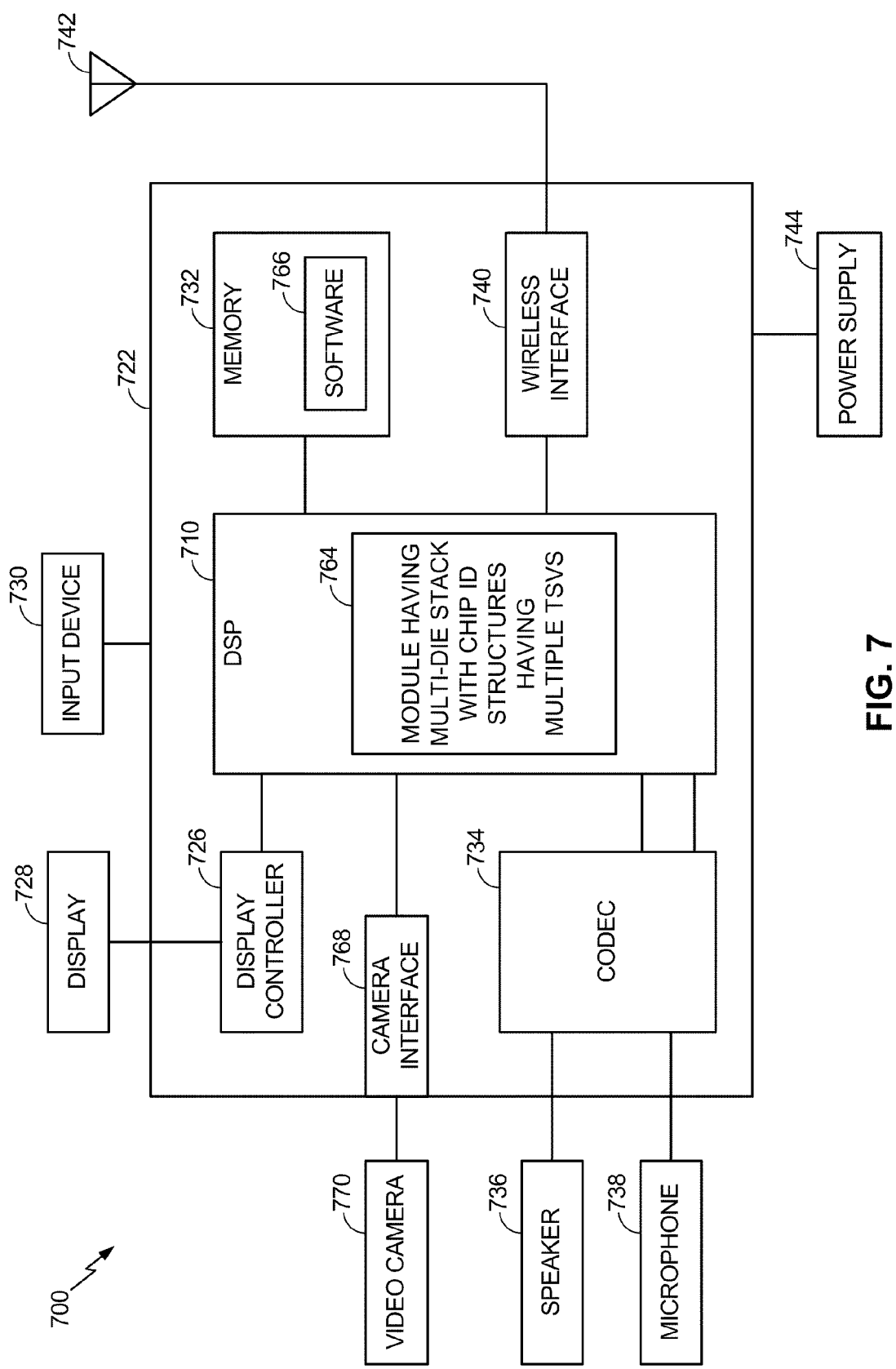
FIG. 7 is a block diagram of a particular embodiment of a portable communication device including a module having a multi-die stack with chip identifier structures.

FIG. 7 is a block diagram of particular embodiment of a system 700 including a module having a multi-die stack with a chip identifier structure having multiple TSVs 764. The system 700 may be implemented in a portable electronic device and includes a processor 710, such as a digital signal processor (DSP), coupled to computer readable medium, such as a memory 732, storing computer readable instructions, such as software 766. The system 700 includes the module having a multi-die stack with a chip identifier structure having multiple TSVs 764. In an illustrative example, the module having a multi-die stack with a chip identifier structure having multiple TSVs 764 includes any of the embodiments of a multi-die stack with a chip identifier structure of FIG. 1, FIG. 3, or FIG. 4, produced in accordance with the embodiment of FIG. 6, or any combination thereof. The module having a multi-die stack with a chip identifier structure having multiple TSVs 764 may be in the processor 710 or may be a separate device or circuitry (not shown). In a particular embodiment, as shown in FIG. 7, the module having a multi-die stack with a chip identifier structure having multiple TSVs 764 is accessible to the digital signal processor (DSP) 710. In another particular embodiment, the memory 732 may include the module having a multi-die stack with a chip identifier structure having multiple TSVs 764.

A camera interface 768 is coupled to the processor 710 and also coupled to a camera, such as a video camera 770. A display controller 726 is coupled to the processor 710 and to a display device 728. A coder/decoder (CODEC) 734 can also be coupled to the processor 710. A speaker 736 and a microphone 738 can be coupled to the CODEC 734. A wireless interface 740 can be coupled to the processor 710 and to a wireless antenna 742.

In a particular embodiment, the processor 710, the display controller 726, the memory 732, the CODEC 734, the wireless interface 740, and the camera interface 768 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, the video camera 770, and the power supply 744 are external to the system-on-chip device 722. However, each of the display device 728, the input device 730, the speaker 736, the microphone 738, the wireless antenna 742, the video camera 770, and the power supply 744 can be coupled to a component of the system-on-chip device 722, such as an interface or a controller.

Figure 8:
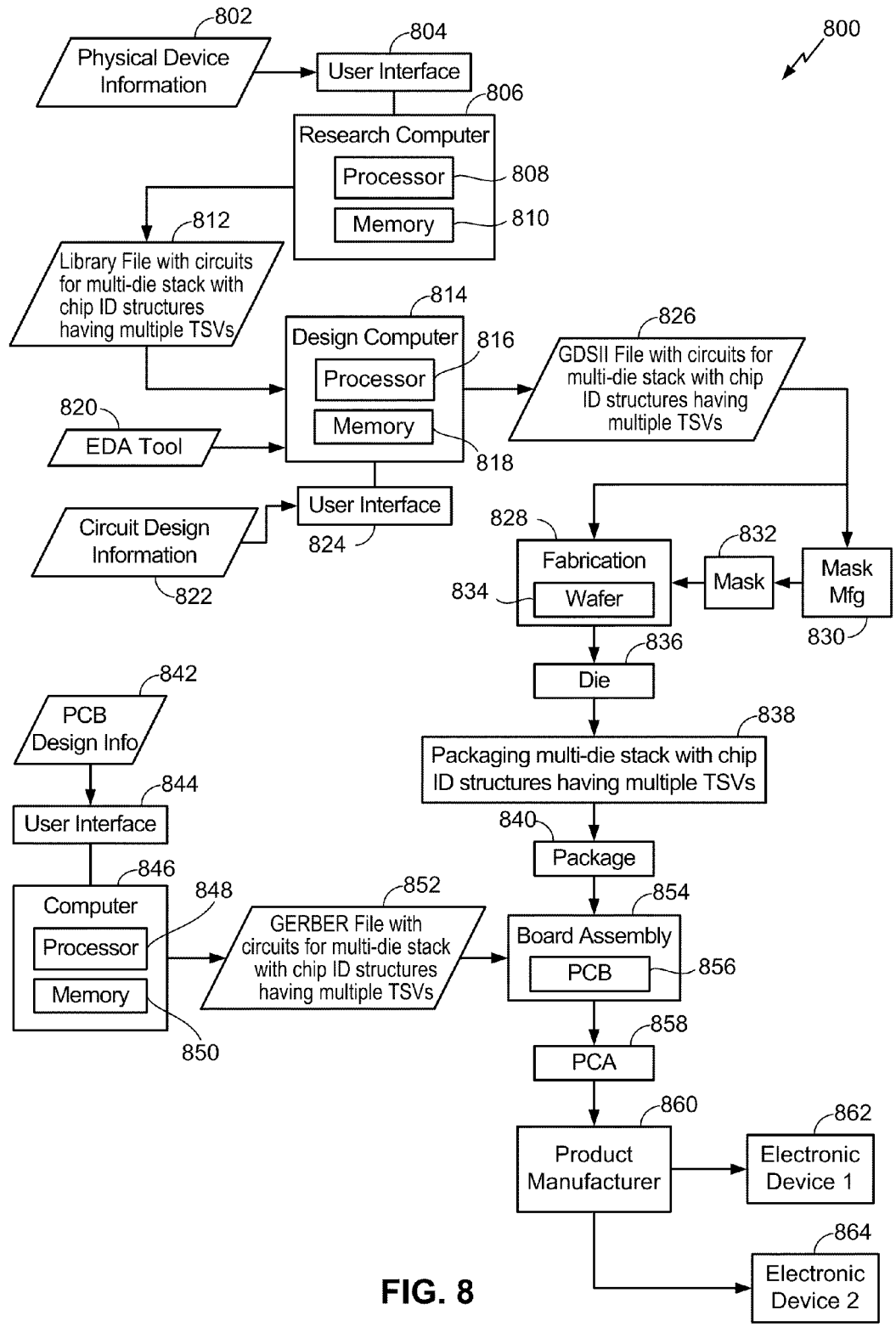
FIG. 8 is a data flow diagram illustrating a manufacturing process for use with multi-die stacks having chip identifier structures.

The foregoing disclosed devices and functionalities (such as the devices of FIG. 1, FIG. 2, FIG. 3, FIG. 4, or FIG. 5, the method of FIG. 6, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the multi-die device 100 of FIG. 1, the multi-die device 300 of FIG. 3, or the multi-die device 400 of FIG. 4. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including the multi-die device 100 of FIG. 1, the multi-die device 300 of FIG. 3, or the multi-die device 400 of FIG. 4, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit using the multi-die device 100 of FIG. 1, the multi-die device 300 of FIG. 3, or the multi-die device 400 of FIG. 4, of the library file 812. For example, a user of the design computer 814 may enter circuit design information 822 via a user interface 824 coupled to the design computer 814. The circuit design information 822 may include design information representing at least one physical property of a semiconductor device, such as the multi-die device 100 of FIG. 1, the multi-die device 300 of FIG. 3, or the multi-die device 400 of FIG. 4. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the multi-die device 100 of FIG. 1, the multi-die device 300 of FIG. 3, or the multi-die device 400 of FIG. 4, in addition to other circuits or information. To illustrate, the data file may include information corresponding to a system-on-chip (SOC) that includes the multi-die device 100 of FIG. 1, the multi-die device 300 of FIG. 3, or the multi-die device 400 of FIG. 4 and that also includes additional electronic circuits and components within the SOC.

The GDSII file 826 may be received at a fabrication process 828 to manufacture the multi-die device 100 of FIG. 1, the multi-die device 300 of FIG. 3, or the multi-die device 400 of FIG. 4, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit for use with the multi-die device 100 of FIG. 1, the multi-die device 300 of FIG. 3, or the multi-die device 400 of FIG. 4.

The die 836 may be provided to a packaging process 838 where the die 836 is incorporated into a representative package 840. For example, the package 840 may include multiple dies 836, such as the multi-die device 100 of FIG. 1, the multi-die device 300 of FIG. 3, the multi-die device 400 of FIG. 4, or a system-in-package (SiP) arrangement, or any combination thereof. The package 840 may be configured to conform to one or more standards or specifications, such as Joint Electron Device Engineering Council (JEDEC) standards. The packaging process 838 may include a processor coupled to a computer-readable tangible medium storing instructions executable by a computer. The processor may be integrated into an electronic device, such as a computer or an electronic packaging device. The instructions may include instructions that are executable by the computer to initiate forming a stack of N dies, where N is an integer greater than one. Each of the N dies includes a chip identifier structure that includes a first set of N TSVs that are each hard wired to a set of external electrical contacts. Each of the N dies also includes chip identifier selection logic coupled to the chip identifier structure. Each of the N dies further includes a chip select structure that includes a second set of N TSVs coupled to the chip identifier selection logic. The instructions may also include instructions that are executable by the computer to initiate coupling each external electrical contact in each set of external electrical contacts to a voltage source or to ground. Each of the first set of N TSVs has a pad that is coupled to an adjacent TSV. Each of the second set of N TSVs is coupled to its own respective pad. Execution at the packaging process 838 of the instructions stored in the computer-readable tangible medium may result in the package 840 including multiple dies 836, such as the multi-die device 100 of FIG. 1, the multi-die device 300 of FIG. 3, the multi-die device 400 of FIG. 4, or any combination thereof.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the multi-die device 100 of FIG. 1, the multi-die device 300 of FIG. 3, or the multi-die device 400 of FIG. 4.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the multi-die device 100 of FIG. 1, the multi-die device 300 of FIG. 3, or the multi-die device 400 of FIG. 4. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, the multi-die device 100 of FIG. 1, the multi-die device 300 of FIG. 3, or the multi-die device 400 of FIG. 4, may be fabricated, processed, and incorporated into an electronic device, as described in the illustrative process 800. One or more aspects of the embodiments disclosed with respect to FIGS. 1-6 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. For example, the GDSII file 826 or the fabrication process 828 can include a computer readable tangible medium storing instructions executable by a computer, the instructions including instructions that are executable by the computer to initiate formation of the multi-die device 100 of FIG. 1, the multi-die device 300 of FIG. 3, or the multi-die device 400 of FIG. 4. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A multi-die stacked semiconductor device comprising:
    a stack of at least two dies, wherein each die comprises:
        a chip identifier structure that comprises a first set of at least two through silicon vias that are each hard wired to a set of external electrical contacts, wherein each external contact is coupled to a voltage source or ground, wherein each of the first set of through silicon vias has a pad that is coupled to an adjacent through silicon via;
        chip identifier selection logic coupled to the chip identifier structure; and
        a chip select structure that comprises a second set of at least two through silicon vias coupled to the chip identifier selection logic, wherein each of the second set of through silicon vias is coupled to its own respective pad.

2. The multi-die stacked semiconductor device of claim 1, further comprising at least one of: a set top box, a music player, a video player, an entertainment unit, a navigation device, a communications device, a personal digital assistant (PDA), a fixed location data unit, or a computer, into which the multi-die stacked semiconductor device is integrated.

3. A method of making a stacked multi-die semiconductor device, the method comprising:
    forming a stack of at least two dies, wherein each die comprises:
        a chip identifier structure that comprises a first set of at least two through silicon vias that are each hard wired to a set of external electrical contacts;
        chip identifier selection logic coupled to the chip identifier structure; and
        a chip select structure that comprises a second set of at least two through silicon vias coupled to the chip identifier selection logic; and
    coupling each external electrical contact to a voltage source or to ground, wherein each of the first set of through silicon vias has a pad that is coupled to an adjacent through silicon via and each of the second set of through silicon vias is coupled to its own respective pad.

4. The method of claim 3, wherein each die further comprises a common access channel structure that comprises a plurality of through silicon vias.

5. The method of claim 3, wherein the stack of dies is formed on a package substrate that supplies the voltage source and the ground and the package substrate has a plurality of package balls formed on a side of the package substrate opposite the stack of dies, the plurality of package balls comprising at least two chip select package balls coupled to the second set of through silicon vias in the chip select structure of one die of the stack of dies.

6. The method of claim 3, wherein the stack of dies comprises a stack of memory dies.

7. The method of claim 3, wherein the stack of dies is formed on a mother die that supplies the voltage source and the ground and the mother die comprises a third set of at least two through silicon vias coupled to the first set of through silicon vias in the chip identifier structure of one die of the stack of dies and a fourth set of at least two through silicon vias coupled to the second set of through silicon vias in the chip select structure of the one die of the stack of dies.

8. The method of claim 7, wherein the mother die comprises a logic chip, the stack of dies comprises a stack of memory dies, and the fourth set of through silicon vias is coupled to a memory channel physical layer of the mother die.

9. The method of claim 3, wherein each die of the stack of dies is substantially the same and the stack of dies is formed without programming, sorting, marking, or separating each die of the stack of dies.

10. The method of claim 3, wherein the forming and the coupling are initiated by a processor integrated into an electronic device.

11. The method of claim 3, further comprising integrating the stacked multi-die semiconductor device into at least one of: a set top box, a music player, a video player, an entertainment unit, a navigation device, a communications device, a personal digital assistant (PDA), a fixed location data unit, or a computer.

12. A method comprising:
    a first step for forming a stack of at least two dies, wherein each die comprises:
        a chip identifier structure that comprises a first set of at least two through silicon vias that are each hard wired to a set of external electrical contacts;

chip identifier selection logic coupled to the chip identifier structure; and
a chip select structure that comprises a second set of at least two through silicon vias coupled to the chip identifier selection logic; and
a second step for coupling each external electrical contact to a voltage source or to ground, wherein each of the first set of through silicon vias has a pad that is coupled to an adjacent through silicon via and each of the second set of through silicon vias is coupled to its own respective pad.

13. The method of claim 12, wherein the first step and the second step are initiated by a processor that is integrated into an electronic device.

14. A multi-die stacked semiconductor device comprising:
a stack of at least two dies, wherein each die comprises:
means for identifying a chip that comprises a first set of at least two through silicon vias that are each hard wired to a set of means for making external electrical contact, wherein each means for making external electrical contact is coupled to a voltage source or ground, wherein each of the first set of through silicon vias has a pad that is coupled to an adjacent through silicon via;
means for selecting a chip identifier coupled to the means for identifying a chip; and
means for selecting a chip that comprises a second set of at least two through silicon vias coupled to the means for selecting a chip identifier, wherein each of the second set of through silicon vias is coupled to its own respective pad.

15. The multi-die stacked semiconductor device of claim 14, further comprising at least one of: a set top box, a music player, a video player, an entertainment unit, a navigation device, a communications device, a personal digital assistant (PDA), a fixed location data unit, or a computer, into which the multi-die stacked semiconductor device is integrated.

* * * * *